United States Patent [19]

Tsuruno

[11] Patent Number: 5,235,620
[45] Date of Patent: Aug. 10, 1993

[54] INFORMATION SIGNAL DEMODULATING APPARATUS

[75] Inventor: Kunio Tsuruno, Tokyo, Japan

[73] Assignee: Canon Kabushiki Kaisha, Tokyo, Japan

[21] Appl. No.: 425,551

[22] Filed: Oct. 23, 1989

[30] Foreign Application Priority Data

Oct. 27, 1988 [JP] Japan .................................. 63-272537
Oct. 27, 1988 [JP] Japan .................................. 63-272538

[51] Int. Cl.⁵ .............................................. H03K 9/04
[52] U.S. Cl. ...................................... 375/80; 329/306; 375/84
[58] Field of Search ............... 329/304, 306, 307, 309, 329/310, 336, 345; 360/29, 40, 44; 375/80, 81, 83, 84, 85; 370/12; 358/143, 145, 146

[56] References Cited

U.S. PATENT DOCUMENTS

| | | | |
|---|---|---|---|
| 3,571,712 | 3/1971 | Hellwarth et al. | 329/306 |
| 4,320,345 | 3/1982 | Waggener | 329/307 |
| 4,628,271 | 12/1986 | Takayama | 375/84 |
| 4,704,582 | 11/1987 | Dixon et al. | 375/81 |
| 4,714,892 | 12/1987 | Ishizuka | 375/84 |
| 4,746,872 | 5/1988 | Yamagata | 329/306 |
| 4,807,251 | 2/1989 | Shibano | 375/85 |
| 4,847,876 | 7/1989 | Baumbach et al. | 375/120 |
| 4,975,928 | 12/1990 | Horsten | 375/114 |

*Primary Examiner*—Benedict V. Safourek
*Attorney, Agent, or Firm*—Robin, Blecker, Daley & Driscoll

[57] ABSTRACT

An information signal restoring apparatus of this invention is arranged to receive a modulated information signal formed by modulating a predetermined carrier signal in accordance with an information signal and then to restore the input modulated information signal to the original information signal. The information signal restoring apparatus is arranged to receive the modulated information signal to generate a frequency signal which is phase synchronized with a modulated information signal which is input during a first period and then to generate an information signal on the basis of the result of a phase comparison made between the frequency signal generated by the frequency signal generating means and a modulated information signal which is input during a second period different from the first period. Accordingly, it is possible to restore the modulated information signal to the original information signal stably and accurately by means of a simplified construction.

10 Claims, 12 Drawing Sheets

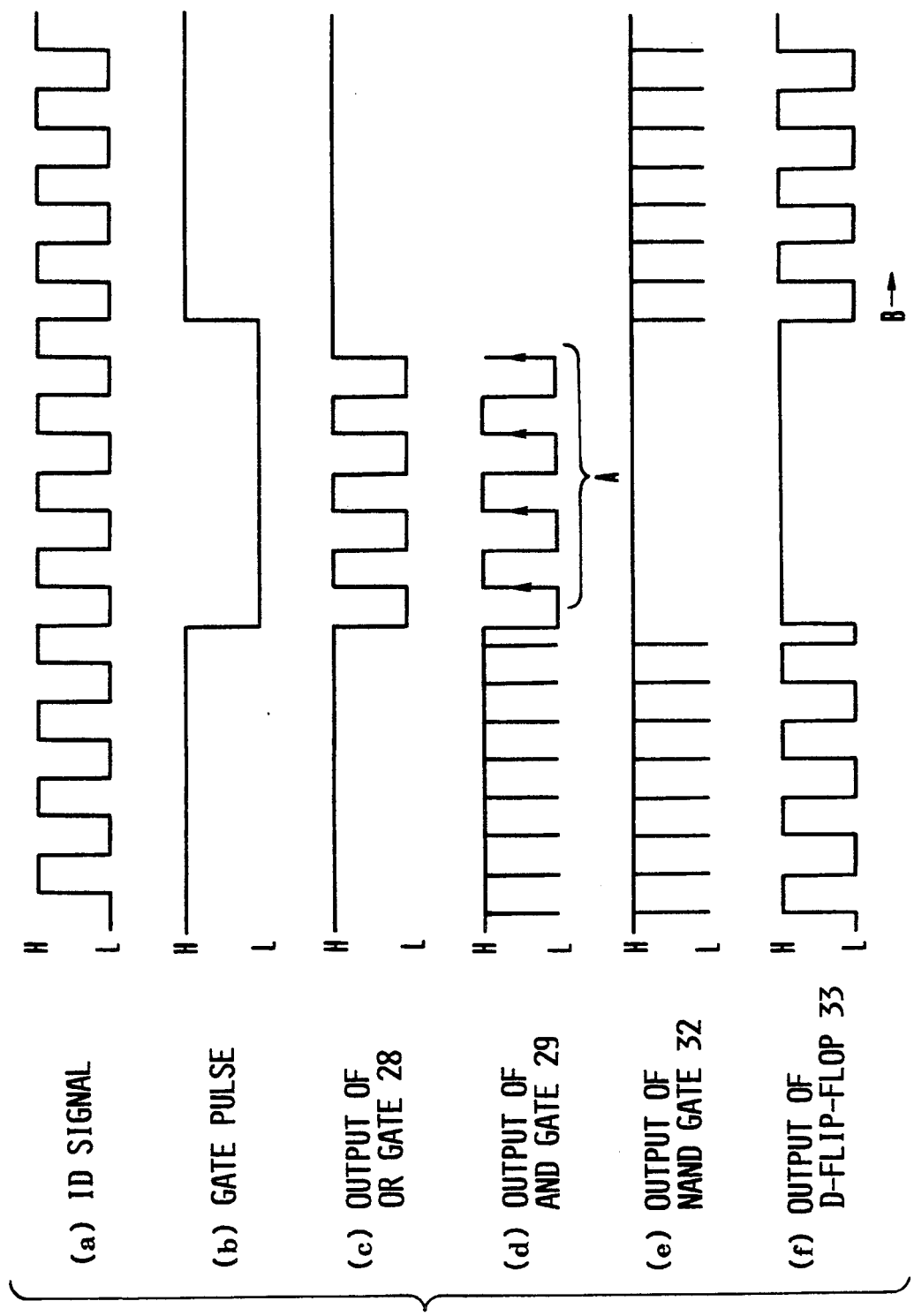

INFORMATION SIGNAL DEMODULATING APPARATUS

BACKGROUND OF THE INVENTION

1. Field of the Invention

The present invention relates generally to an information signal restoring apparatus which is arranged to restore a modulated information signal, formed by modulating a predetermined carrier signal in accordance with an information signal, to the original information signal.

2. Description of the Related Art

Electronic still video systems of the type which are arranged to record, for example, still image signals on and reproduce them from magnetic discs have heretofore been known. Such an electronic still video system is typically arranged so that index (ID) data representing information concerning a date and time corresponding to the still image signal is recorded on a magnetic disc together with the still image signal.

The ID data is recorded on the magnetic disc by the method including the steps of modulating a corresponding ID signal by a known DPSK process (differential phase-shift keying process) using a signal ($13f_H$) of frequency thirteen times as high as that of a horizontal synchronizing signal and multiplexing the ID signal of the differentially phase-shift keyed form with a concerning still image signal. If the ID signal thus recorded is to be reproduced, a demodulator such as that shown in FIG. 1 is used for purposes of demodulation.

FIG. 1 is a schematic block diagram of a conventional type of demodulator for demodulating a so-called two-phase DPSK signal, and FIG. 2 is a timing chart showing waveforms appearing at the various points shown in FIG. 1.

The demodulator shown in FIG. 1 includes the following major elements: an input terminal 1 at which a DPSK signal is provided, a shift register 2, an exclusive OR (EXOR) circuit 3, a low-pass filter (LPF) 4, a buffer amplifier 5 and an output terminal 6 at which a demodulated version of the DPSK signal is provided.

The DPSK signal, which is provided at the input terminal 1, has the waveform shown in Part (a) of FIG. 2, and serves to transmit one bit of data in each period indicated by T in the same part. This signal of Part (a) is read into the shift register 2 in accordance with a clock which is input thereto through a terminal 7, the clock being shown in Part (g) of FIG. 2.

The number of bits of the shift register 2 is determined as follows:

$$N=T/t(T>t)$$

where N represents the number of bits and t represents the period of the clock (g). It follows, therefore, that the DPSK signal is delayed by the period T by the shift register 2. The output signal from the shift register 2, shown in Part (b) of FIG. 2, and the input DPSK signal shown in Part (a) are input to the EXOR circuit 3, and the EXOR circuit 3 provides the output signal shown in Part (c) of FIG. 2. This signal of Part (c) passes through the LPF 4, where it is converted into a demodulated signal having the waveform shown in Part (e) of FIG. 2. The waveform of this signal is then shaped by the buffer amplifier 5 to provide a demodulated signal of the DPSK signal, which has the waveform shown in Part (f) of FIG. 2.

As is known, the aforesaid DPSK signal serves to represent one bit of information in accordance with whether or not the phase of the aforesaid signal of frequency $13f_H$ is reversed every 4H or 2H period (H: horizontal synchronizing period). Accordingly, the conventional demodulator consecutively detects the phase state of the DPSK signal throughout the 4H or 2H period, and restores binary information "1" if the state of phase reversal lasts for a time period which is longer than or equal to half the 4H or 2H period and, restores binary information "0" if such a state lasts for a time period which is shorter than the same period.

However, the above-described type of apparatus, commonly arranged so that the 4H or 2H period during which detection of the phase state is performed, is specified in synchronization with a horizontal synchronizing signal multiplexed with the DPSK signal. However, the DPSK signal is susceptible to signal deterioration due to phase fluctuations, level attenuation or the like during certain time periods which last before and after each horizontal synchronizing signal appears. Accordingly, it is difficult to stably detect the phase state during such a time period, thus resulting in the likelihood that restored information may contain errors.

In addition, the conventional apparatus has the problem that its circuit scale must be increased because of the following reason.

In the electronic still video system which employs a carrier signal of frequency $13f_H$ as described previously, one bit of information is represented with four or two horizontal synchronizing signals. Accordingly, one bit of information may be represented with horizontal synchronizing signals corresponding to the maximum 52 periods (4×13).

However, if such signals are to be stored in the form of a waveform, sampling needs to be repeated at least five times per period and a shift register of 260 stages (52×5) is therefore required as the shift register 2 of FIG. 1.

If such a 260-stage shift register is to be realized, two hundred and sixty D-flip-flops are needed as shown by, for example, $F_1$–$F_{260}$ in FIG. 3. As a result, the circuit scale becomes excessively large and an increase in cost will be incurred.

SUMMARY OF THE INVENTION

It is, therefore, an object of the present invention to provide an information signal restoring apparatus which makes it possible to solve the above-described problems.

It is another object of the present invention to provide an information signal restoring apparatus which is capable of restoring a modulated information signal to the original information signal stably and accurately.

To achieve the above objects, in accordance with the present invention, there is provided an information signal restoring apparatus which is arranged to receive a modulated information signal formed by modulating a predetermined carrier signal in accordance with an information signal and then to restore the input modulated information signal to the original information signal. This apparatus is provided with phase state detecting means for detecting the phase state of the modulated information signal and for outputting a phase state detection signal corresponding to the phase state in each first period, gate means for allowing the phase state detection signal output from the phase state detecting means to pass through the gate means for only a second period which is shorter than the first period, and information signal generating means for generating an information signal on the basis of the phase state detection signal output from the gate means.

It is yet another object of the present invention to provide an information signal restoring apparatus which is capable of restoring a modulated information signal to the original information signal by means of a simplified construction.

To achieve the above object, in accordance with the present invention, there is provided an information signal restoring apparatus which is arranged to receive a modulated information signal formed by modulating a predetermined carrier signal in accordance with an information signal and then by restoring the input modulated information signal to the original information signal. This apparatus is provided with frequency signal generating means for generating a frequency signal having the same frequency as the predetermined carrier signal, phase controlling means for controlling the frequency signal generating means so that the frequency signal generated by the frequency signal generating means is phase synchronized with the first period of the modulated information signal, and information signal generating means arranged to make a phase comparison between the frequency signal generated by the frequency signal generating means and a modulated information signal, which is input during a second period, different from the first period and then to generate an information signal on the basis of the result of the phase comparison.

Further objects, features and advantages of the present invention will become apparent from the following detailed description of embodiments of the present invention with reference to the accompanying drawings.

BRIEF DESCRIPTION OF THE DRAWINGS

FIG. 12 is a timing chart showing the waveforms of signals provided at various points in the oscillator shown in FIG. 9.

DETAILED DESCRIPTION OF THE PREFERRED EMBODIMENTS

Specific embodiments of the present invention will be explained below with reference to the accompanying drawings.

Figure 4:
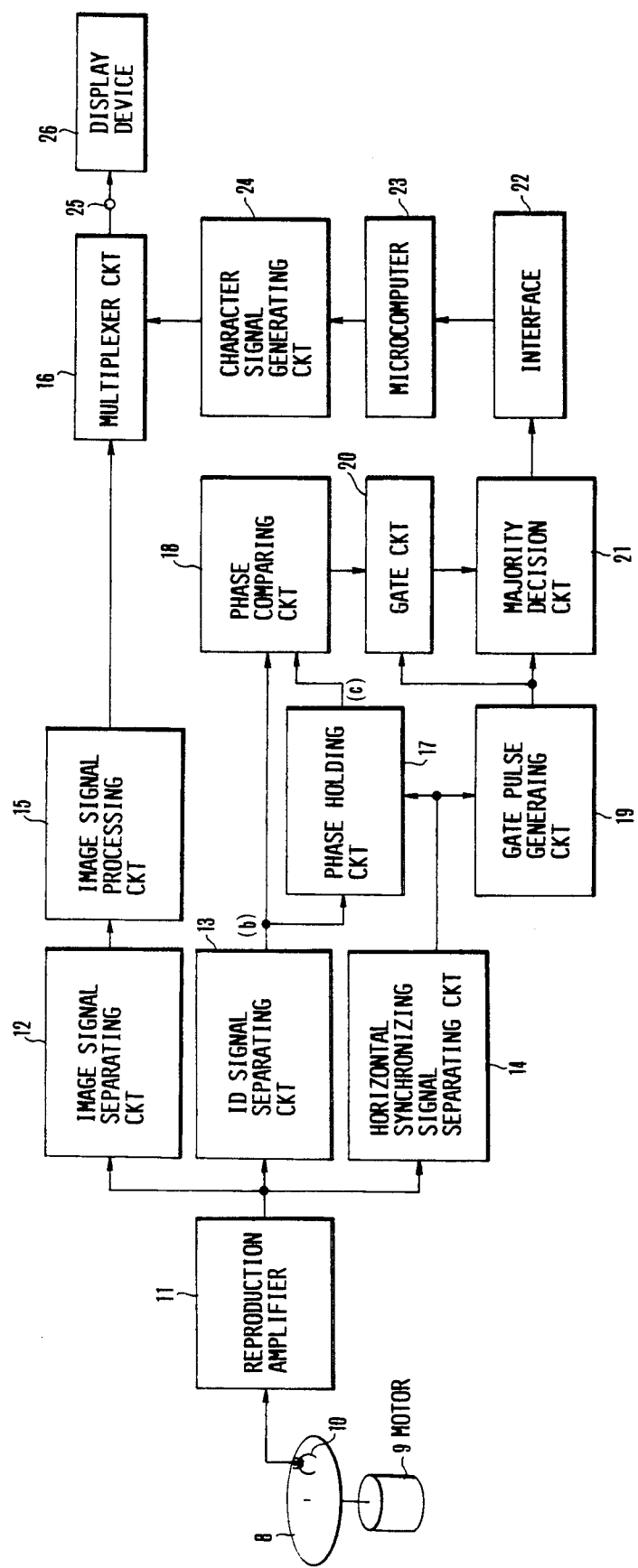
FIG. 4 is a block diagram showing the general construction of the reproducing apparatus used in an electronic still video system to which a first embodiment of the present invention is applied.
Figure 6:
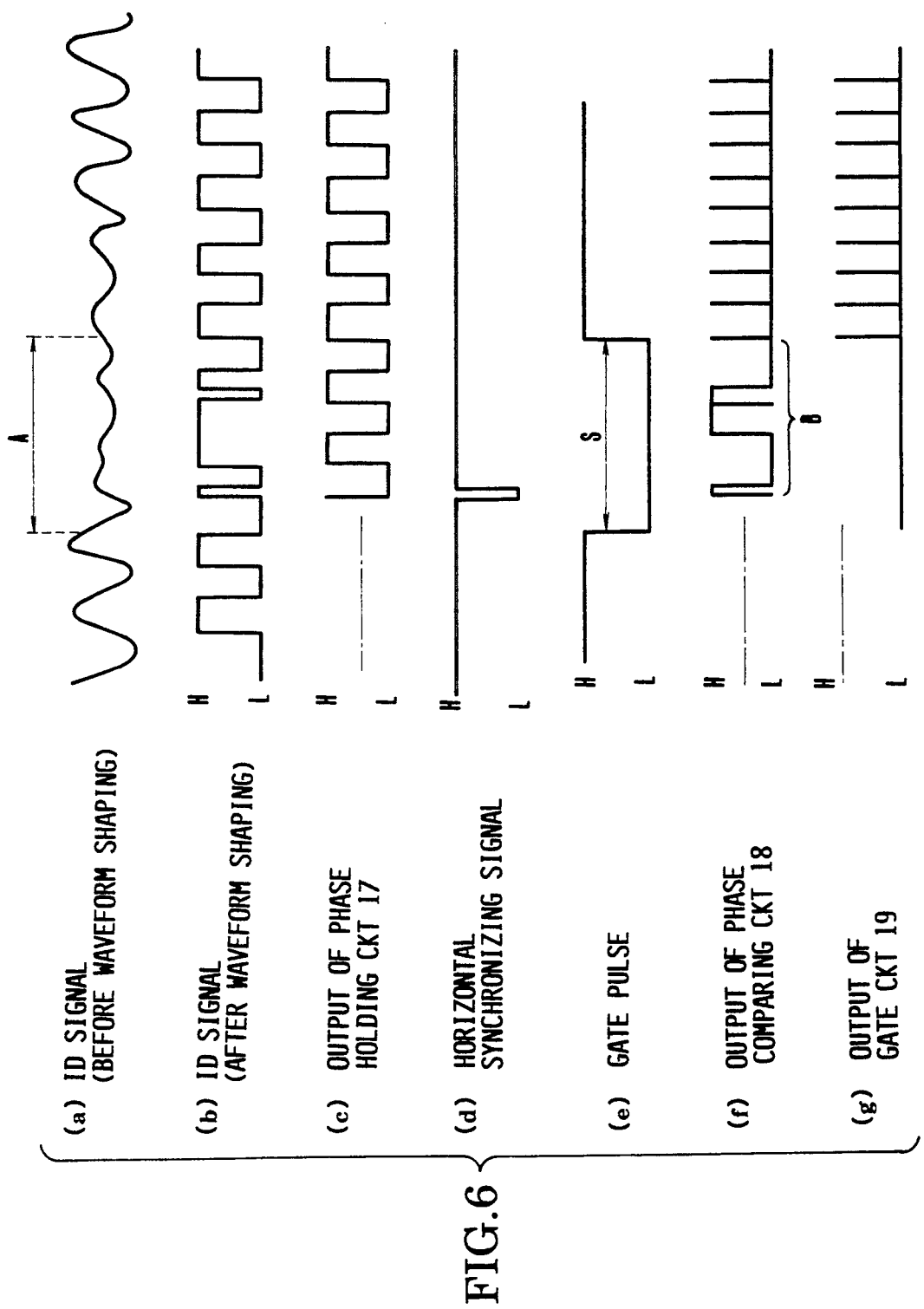
FIG. 6 is a timing chart showing the waveforms of signal provided at various points in the arrangement shown in FIG. 4.

FIG. 4 is a schematic block diagram of the reproducing device of an electronic still video system to which a first embodiment of the present invention is applied. FIG. 6 is a timing chart showing signal waveforms appearing at various points in the arrangement shown in FIG. 4.

In FIG. 4, a magnetic disc 8 is caused to rotate by means of a motor 9 at a predetermined rotational speed, and a magnetic head 10 is positioned at an arbitrary recording track on the rotating magnetic disc 8 by means of a head moving mechanism (not shown), the arbitrary recording track being specified through an operating portion (not shown). The signal recorded on the recording track is reproduced by the magnetic head 10.

The signal, which has been reproduced by the magnetic head 10, is amplified by a reproduction amplifier 11 and is then supplied to an image signal separating circuit 12, an ID signal separating circuit 13 and a horizontal synchronizing signal separating circuit 14.

The image signal separating circuit 12 separates an image signal component from the reproduced signal supplied to it, and the image signal component thus separated is subjected to a known type of restoring process in an image signal processing circuit 15 so that the image signal component is converted into a signal format which conforms to a television signal format according to, for example, the NTSC system. The resulting television signal is supplied to a multiplexer circuit 16.

In the meantime, the ID signal separating circuit 13 separates from the reproduced signal supplied to it an ID signal component which is frequency-multiplexed with this reproduced signal (refer to Part (a) of FIG. 6), then shapes the waveform of the ID signal component (refer to Part (b) of FIG. 6), and then supplies the resulting signal to a phase holding circuit 17 and a phase comparing circuit 18.

The phase holding circuit 17 serves to hold the phase of the previously supplied ID signal of a 4H or 2H period. This circuit 17 is realized using a circuit arrangement such as that shown in, for example, FIG. 5.

Figure 5:
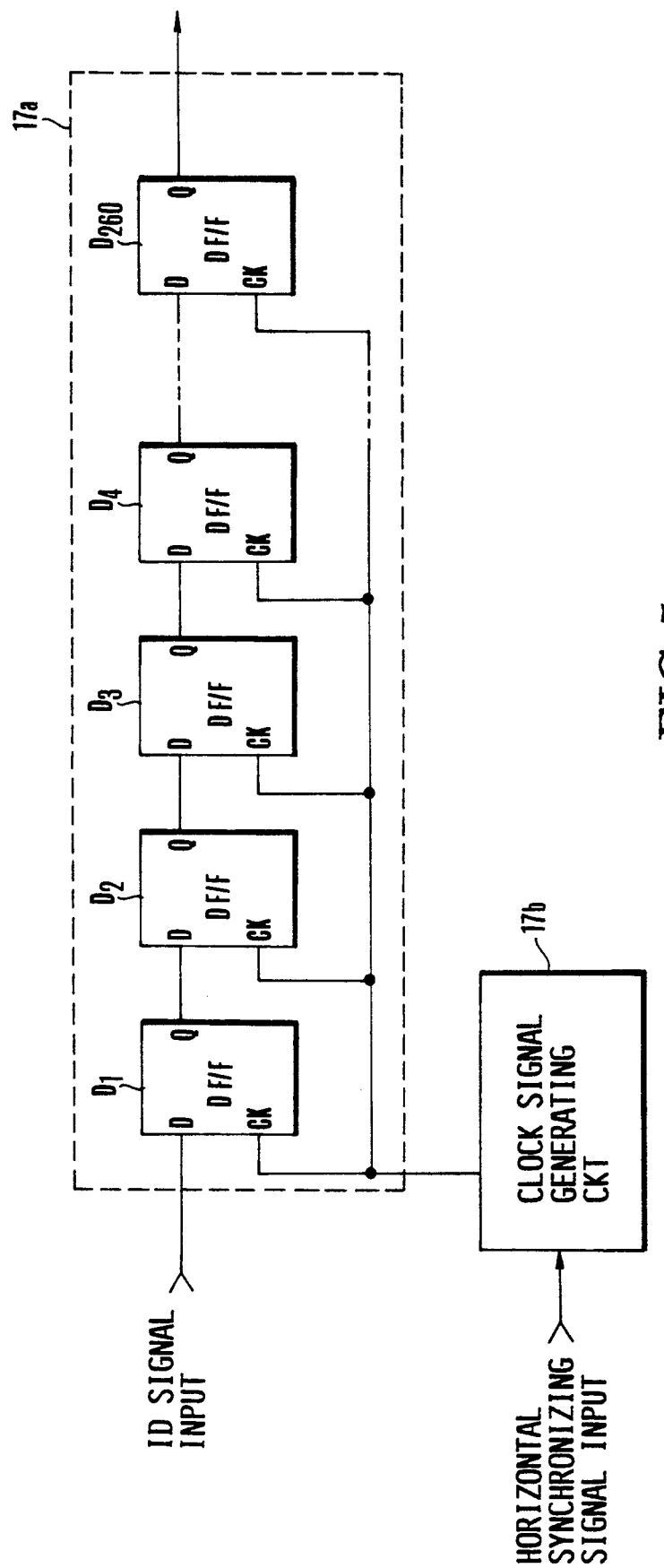
FIG. 5 is a block diagram showing a specific example of the circuit construction of the phase holding circuit of FIG. 4.

FIG. 5 shows an example of the construction of the phase holding circuit 17 of FIG. 4. This phase holding circuit 17 comprises a shift register 17a and a clock signal generating circuit 17b. The shift register 17a consists generally of a total of 260 D-flip-flops $D_1$ to $D_{260}$. The clock signal generating circuit 17b receives the horizontal synchronizing signal separated by the horizontal synchronizing signal separating circuit 14 of FIG. 4 to generate a clock signal of frequency $13f_H$ ($f_H$: horizontal synchronizing frequency) in synchronization with the aforesaid horizontal synchronizing signal.

Figure 1:
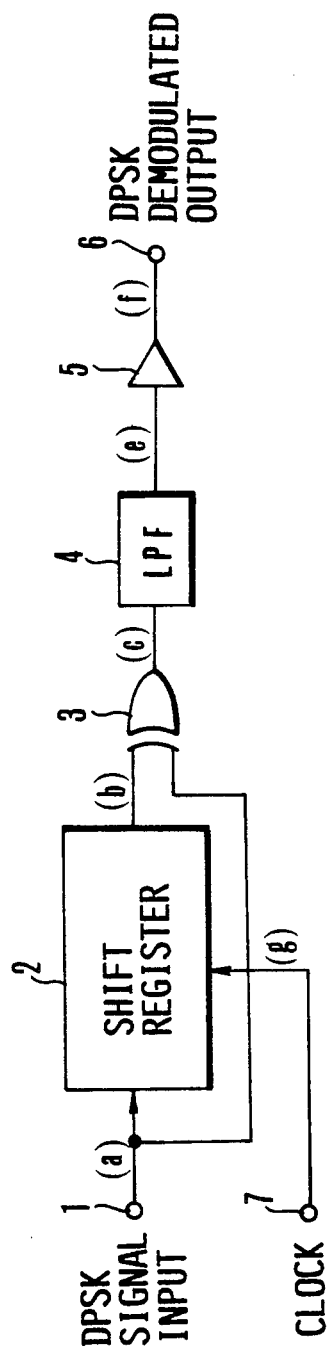
FIG. 1 is a schematic block diagram showing a conventional type of demodulator for use in an electronic still video system.
Figure 2:
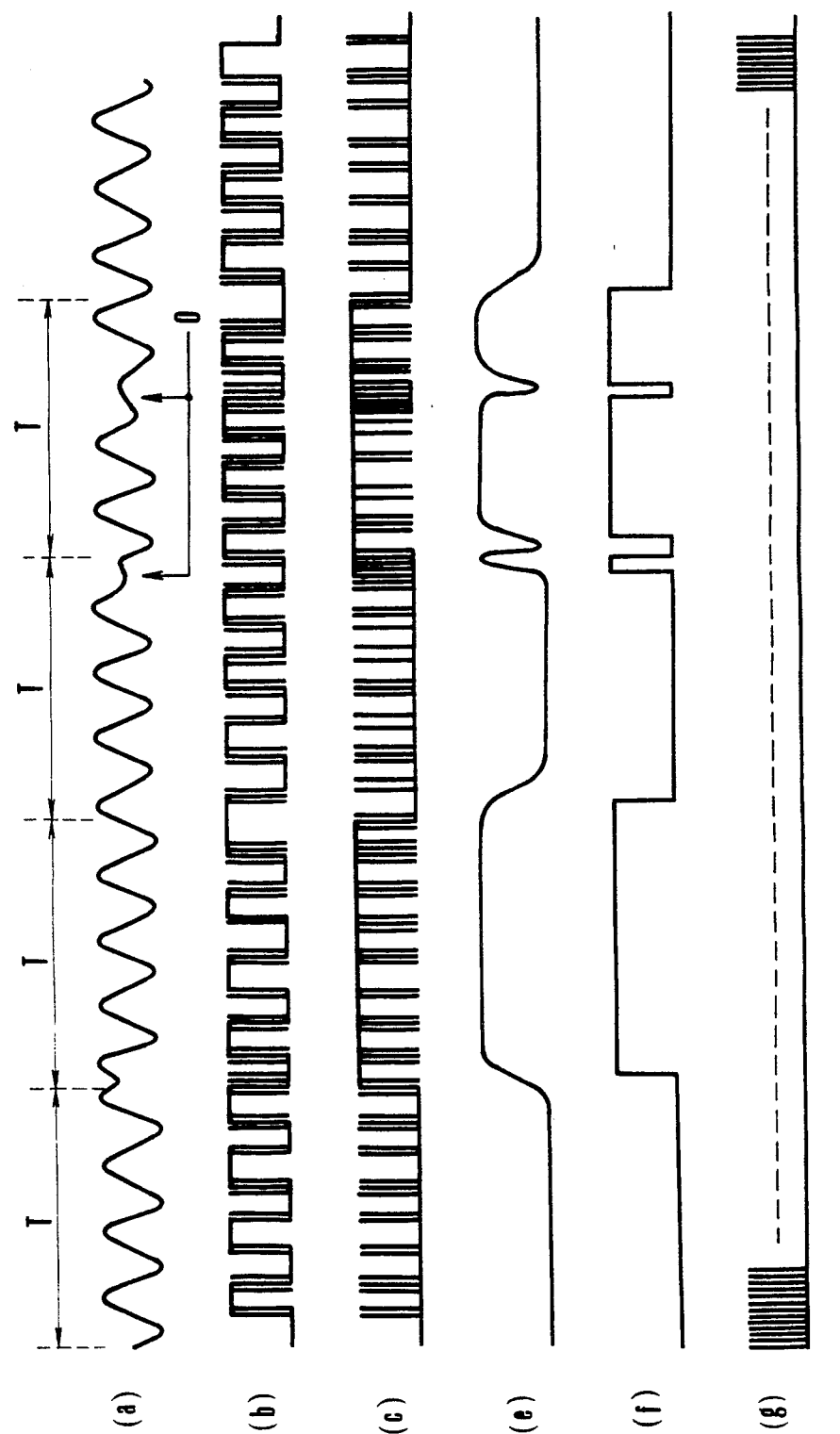
FIG. 2 is a timing chart showing the waveforms of signals provided at various points in the demodulator shown in FIG. 1.
Figure 3:
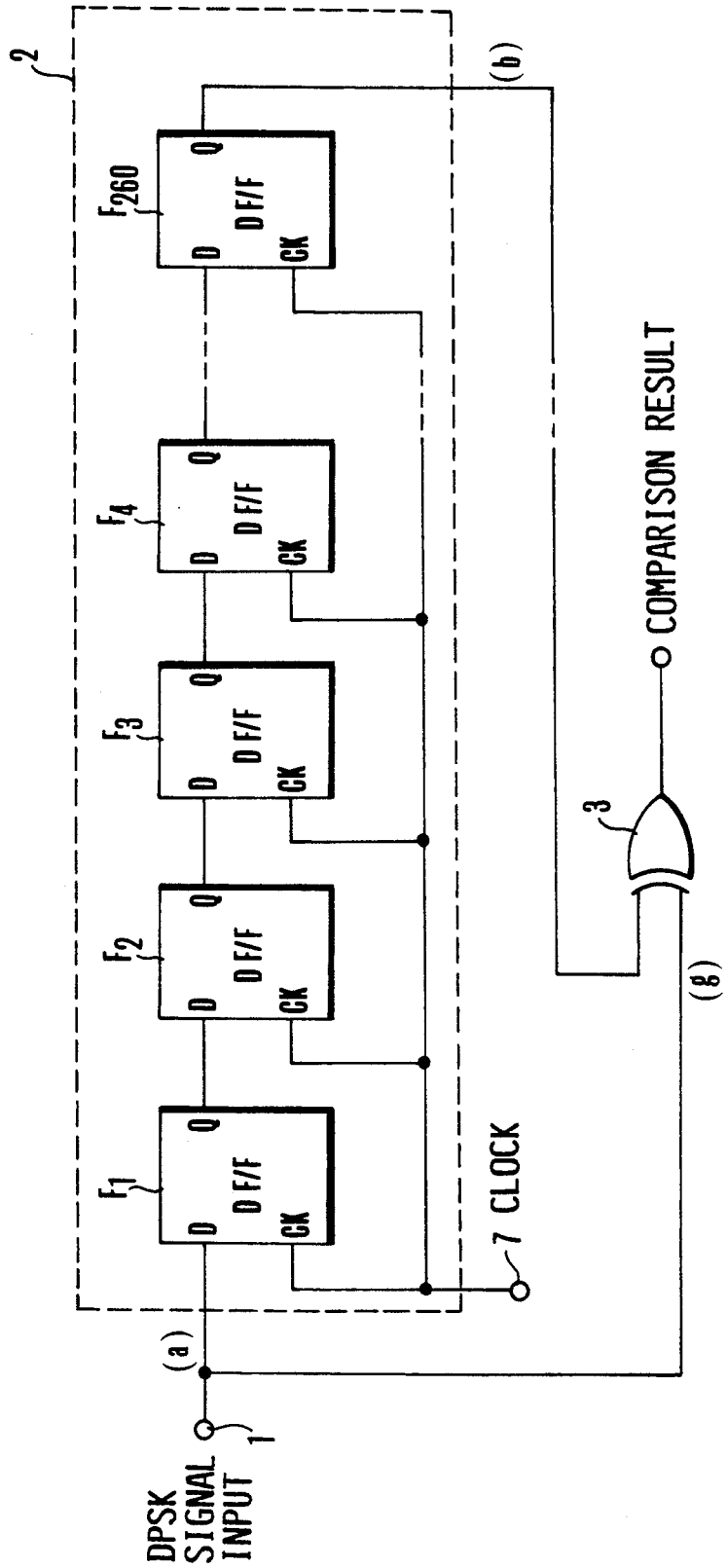
FIG. 3 is a block diagram showing a specific le of the circuit construction of the shifter register of FIG. 1.

The construction of FIG. 5 is substantially the same as that of the shift register 2 shown in FIGS. 1 and 3 and the detailed description thereof is therefore omitted.

The signal which has been output from the phase holding circuit 17 in the above-described manner (refer to Part (c) of FIG. 6) is supplied to the phase comparing circuit 18.

The phase comparing circuit 18 is realized with, for example, an exclusive OR gate. This circuit 18 compares the phase of the supplied ID signal and that of the signal output from the phase holding circuit 17, and then supplies the result of this comparison (refer to Part (f) of FIG. 6) to a gate circuit 20.

The gate circuit 20 supplies the output signal of the phase comparing circuit 18 to a majority decision circuit 21 on the basis of a gate pulse (refer to Part (e) of FIG. 6) output from a gate pulse generating circuit 19.

The gate pulse generating circuit 19 is constructed of a monostable multivibrator and the like. This circuit 19 is synchronized with the horizontal synchronizing signal separated by the horizontal synchronizing separating circuit 14 to generate a gate pulse which is held at its low level (a level "L" in Part (e) of FIG. 6) over a predetermined time period (duration S in the same part) which lasts before and after each horizontal synchronizing pulse, as shown in the same part, thereby controlling the opening and closing operations of the gate of the gate circuit 20.

As shown in FIG. 6, the ID signal with a shaped waveform (the waveform of Part (b) of FIG. 6) which is output from the ID signal separating circuit 13 exhibits a disturbed pulse width because the amplitude level of the signal before waveform shaping (the waveform of Part (a) of FIG. 6) decays before and after the horizontal synchronizing pulse (a duration A in Part (a) of FIG. 6).

The output of the phase comparing circuit 18 becomes a signal which likewise contains error pulses (pulses indicated by B) as shown in Part (f) of FIG. 6 owing to the disturbance of the pulse width of the aforesaid ID signal.

However, the gate circuit 20, to which the signal output from the phase comparing circuit 18 is supplied in the aforesaid manner, allows passage of this signal for only the period during which the gate pulse shown in Part (e) of FIG. 6 is held at its high level (the level "H" in the same part.) Accordingly, a signal (refer to Part (g) of FIG. 6) from which the error pulses have been eliminated is supplied from the gate circuit 20 to the major decision circuit 21.

The majority decision circuit 21 measures and compares the duration of the high-level period and the duration of the low-level period of the signal output from the gate circuit 20 in each period during which the gate pulse output from the gate pulse generating circuit 19 (refer to Part (e) of FIG. 6) is held at the high level (the level "H" in the same part).

If the duration of the high-level period is longer than that of the low-level period, the majority decision circuit 21 outputs a signal which exhibits a high level over a 4H or 2H period. If, on the other hand, the duration of the low-level period is longer than that of the high-level period, the majority decision circuit 21 outputs a signal which exhibits a low level over the 4H or 2H period.

The above-described majority decision circuit 21 serves to suppress the influence of error pulses which may be accidentally produced due to dropouts or the like in the phase comparing circuit 18, which is provided as a front-stage element with respect to the majority decision circuit 21. More specifically, since the ID signal in general contains errors based on jitters or dropouts, it follows that the phase comparing circuit 18 outputs an erroneous comparison result because of such errors. It is believed, notwithstanding, that the period during which such an erroneous decision may take place occupies only a small portion of the overall comparison period. Accordingly, by causing the majority decision circuit 21 to make a majority decision as to the comparison results, error-free decision results can be obtained.

The signal which has been output from the majority decision circuit 21 is in turn supplied to an interface 22. The interface 22 translates the supplied signal into a digital ID Code and supplies it to a microcomputer 23.

The microcomputer 23 decodes the ID code supplied from the interface 22 and controls the operation of the apparatus in accordance with the contents of the decoded ID code.

Moreover, in the arrangement of the above-described embodiment, information representing a date and time is decoded from the ID code, and the decoded information is displayed on a CRT or a similar display device together with a corresponding still image. For this purpose, the microcomputer 23 controls a character signal generating circuit 24 in accordance with the contents of the ID code decoded by the microcomputer 23 to cause the circuit 24 to output a character image signal corresponding to the contents of this ID code. Then, the multiplexer circuit 16 effects multiplexing of the image signal supplied from the image signal processing circuit 15 and the character image signal output from the character signal generating circuit 24. The multiplexed image signal is supplied to an external display device 26 through an output terminal 25 so that a visual display of the still image and the ID information is provided.

As is apparent from the foregoing, in accordance with the first embodiment, the results of phase comparison of ID signals obtained during a predetermined time period (for example, a ½H period) which lasts before and after each horizontal synchronizing pulse are not employed for demodulation of the ID signals, whereby it is possible to stably and accurately effect demodulation of the ID signals.

Figure 7:
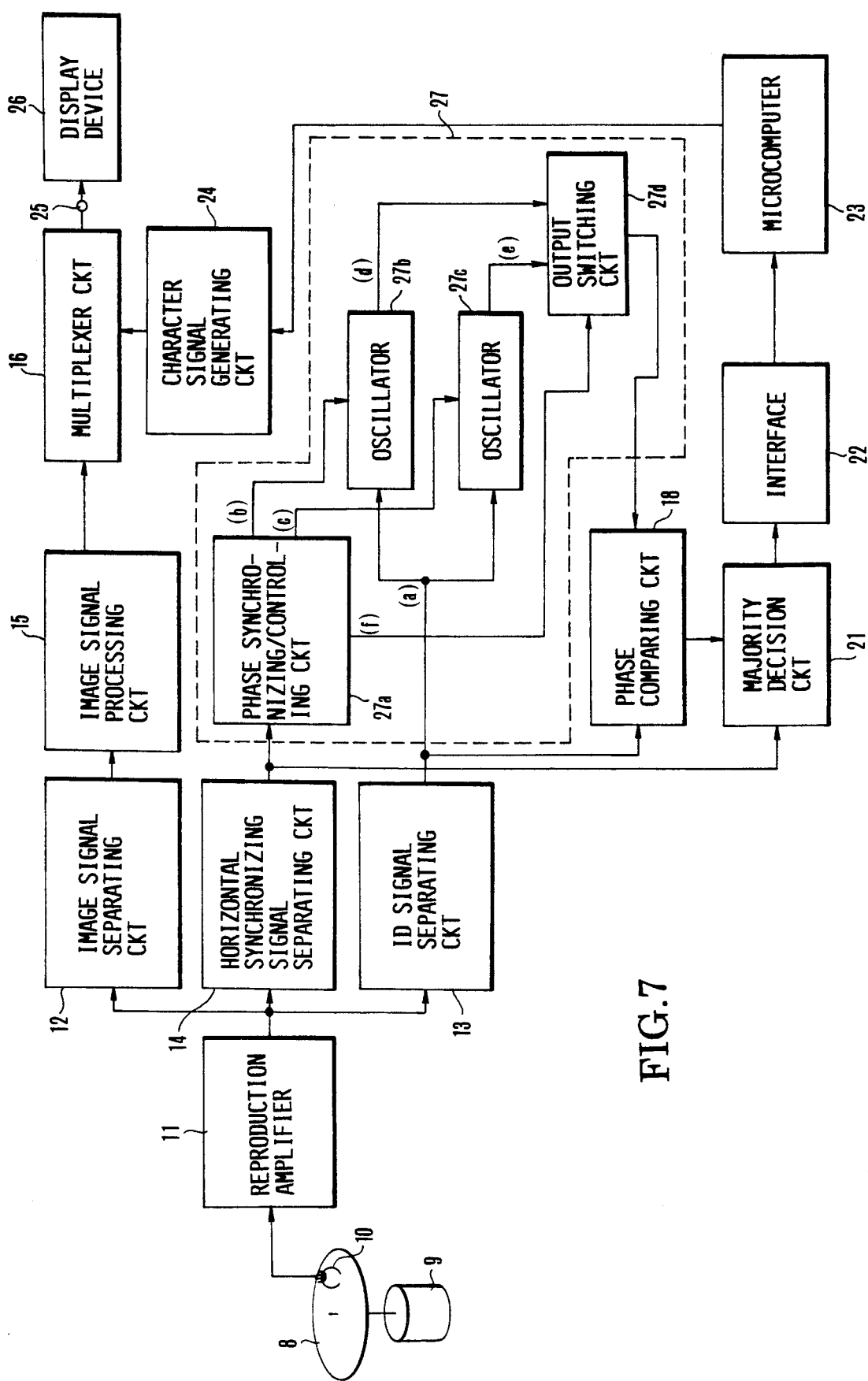
FIG. 7 is a block diagram showing the general construction of the reproducing apparatus used in an electronic still video system to which a second embodiment of the present invention is applied.

FIG. 7 is a schematic block diagram of the reproducing device of an electronic still video system to which a second embodiment of the present invention is applied. In the embodiment shown in FIG. 7, the same reference numerals are used to denote the same elements as those used in the first embodiment shown in FIG. 4.

In FIG. 7, the magnetic disc 8 is caused to rotate by means of the motor 9 at a predetermined rotational speed, and the magnetic head 10 is positioned at an arbitrary recording track on the rotating magnetic disc 8 by means of the head moving mechanism (not shown), the arbitrary recording track being specified through the operating portion (not shown). The signal recorded on the recording track is reproduced by the magnetic head 10.

The signal, which has been reproduced by the magnetic head 10, is amplified by the reproduction amplifier 11 and is then supplied to the image signal separating circuit 12, the ID signal separating circuit 13 and the horizontal synchronizing signal separating circuit 14.

The image signal separating circuit 12 separates an image signal component from the reproduced signal supplied to it, and the image signal component thus separated is subjected to a known type of restoring process in the image signal processing circuit 15 so that the image signal component is converted into a signal format which conforms to a television signal format according to, for example, the NTSC system. The resulting television signal is supplied to the multiplexer circuit 16.

In the meantime, the ID signal separating circuit 13 separates from the reproduced signal supplied to it an ID signal component which is frequency-multiplexed with this reproduced signal, and then supplies the resulting signal to oscillators 27b and 27c in a phase holding circuit 27.

Figure 8:
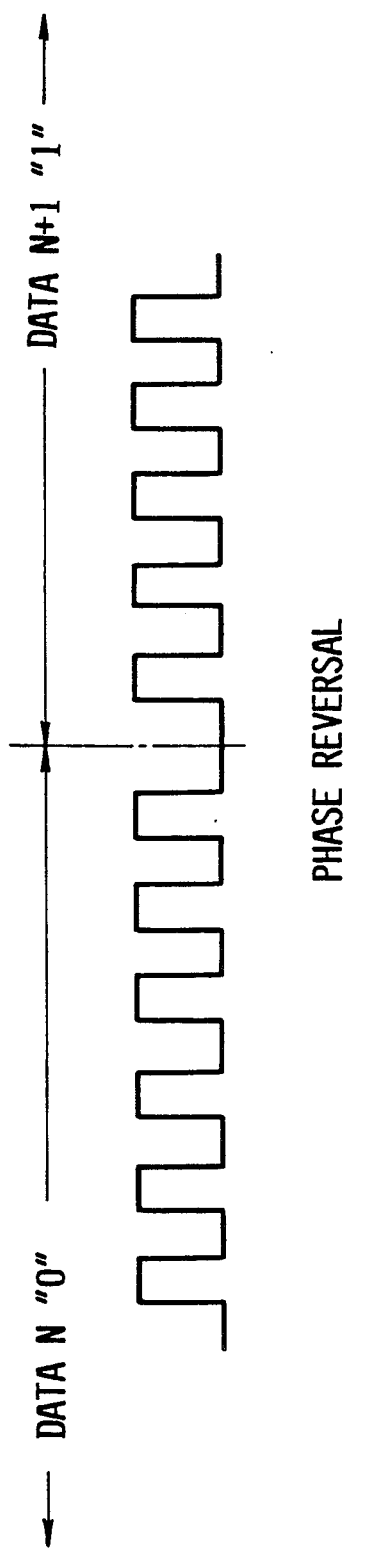
FIG. 8 is a waveform diagram showing the waveform of an ID signal.

Each of the ID signals which have been supplied to the oscillators 27b and 27c in the above-described manner exhibits a waveform having a shape such as that shown in FIG. 8, that is to say, a waveform of reverse phase represents information "1", while a waveform of forward phase represents information "0".

A phase synchronizing/controlling circuit 27a in the phase holding circuit 27 serves to control the phases of the frequency signals output from the respective oscillators 27b and 27c in synchronization with a horizontal synchronizing signal which is extracted by separation in the horizontal synchronizing signal separating circuit 14.

More specifically, both the oscillators 27b and 27c act as oscillators for generating frequency signals of the same frequency as the carrier frequency of the ID signal. The oscillator 27b generates a frequency signal which is phase-synchronized with the ID signal which is supplied in accordance with a gate pulse A (refer to Part (b) of FIG. 10) supplied from the phase synchronizing/controlling circuit 27a, while the oscillator 27c generates a frequency signal which is phase-synchronized with the ID signal which is supplied in accordance with a gate pulse B (refer to Part (c) of FIG. 10) supplied from the phase synchronizing/controlling circuit 27a.

The following is an explanation of the operation of the aforesaid phase synchronizing/controlling circuit 27a to control the phase of the frequency signal generated from each of the generators 27b and 27c.

The horizontal synchronizing signal, which has been separated in the horizontal synchronizing signal separating circuit 14 in the above-described manner, is supplied to the phase synchronizing/separating circuit 27a. The phase synchronizing/separating circuit 27a is synchronized with the horizontal synchronizing signal to generate the gate pulse A (refer to Part (b) of FIG. 10) which is reversed every 4H or 2H period (H: horizontal synchronizing period) and the gate pulse B (refer to Part (c) of FIG. 10) which is in phase reverse to the gate pulse A. The gate pulses A and to the oscillators 27b and 27c, respectively. B are supplied to the oscillators 27b and 27c, respectively.

Figure 10:
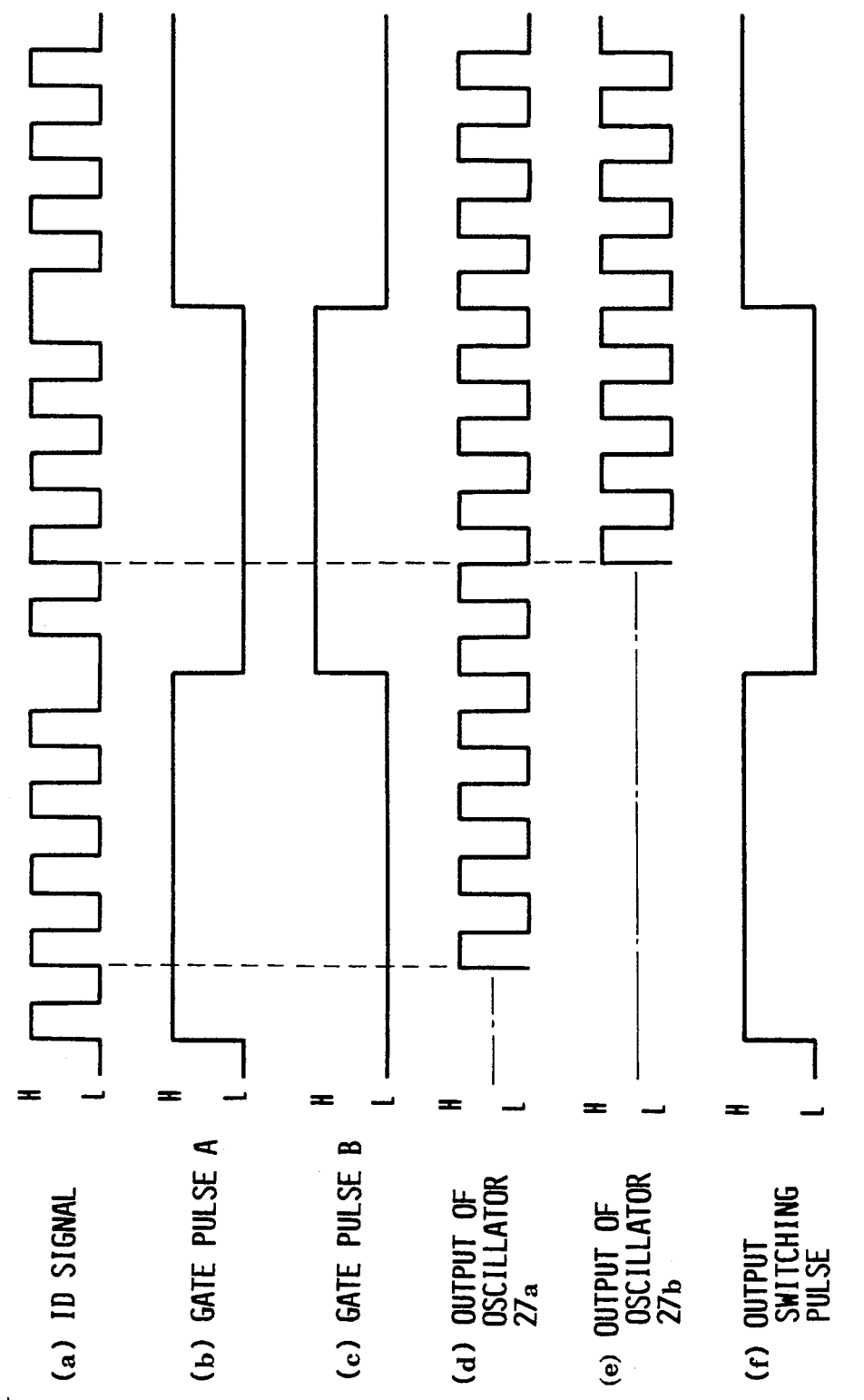
FIG. 10 is a timing chart showing the waveforms of signals provided at various points in the phase holding circuit of FIG. 7.

The oscillators 27b and 27c read the ID signals in the period during which the respective gate pulses A and B supplied from the phase synchronizing/controlling circuit 27a are at their low levels (the levels "L" in Parts (b) and (c) of FIG. 10). The oscillators 27b and 27c thereby oscillate in synchronization with the ID signals thus read.

Figure 9:
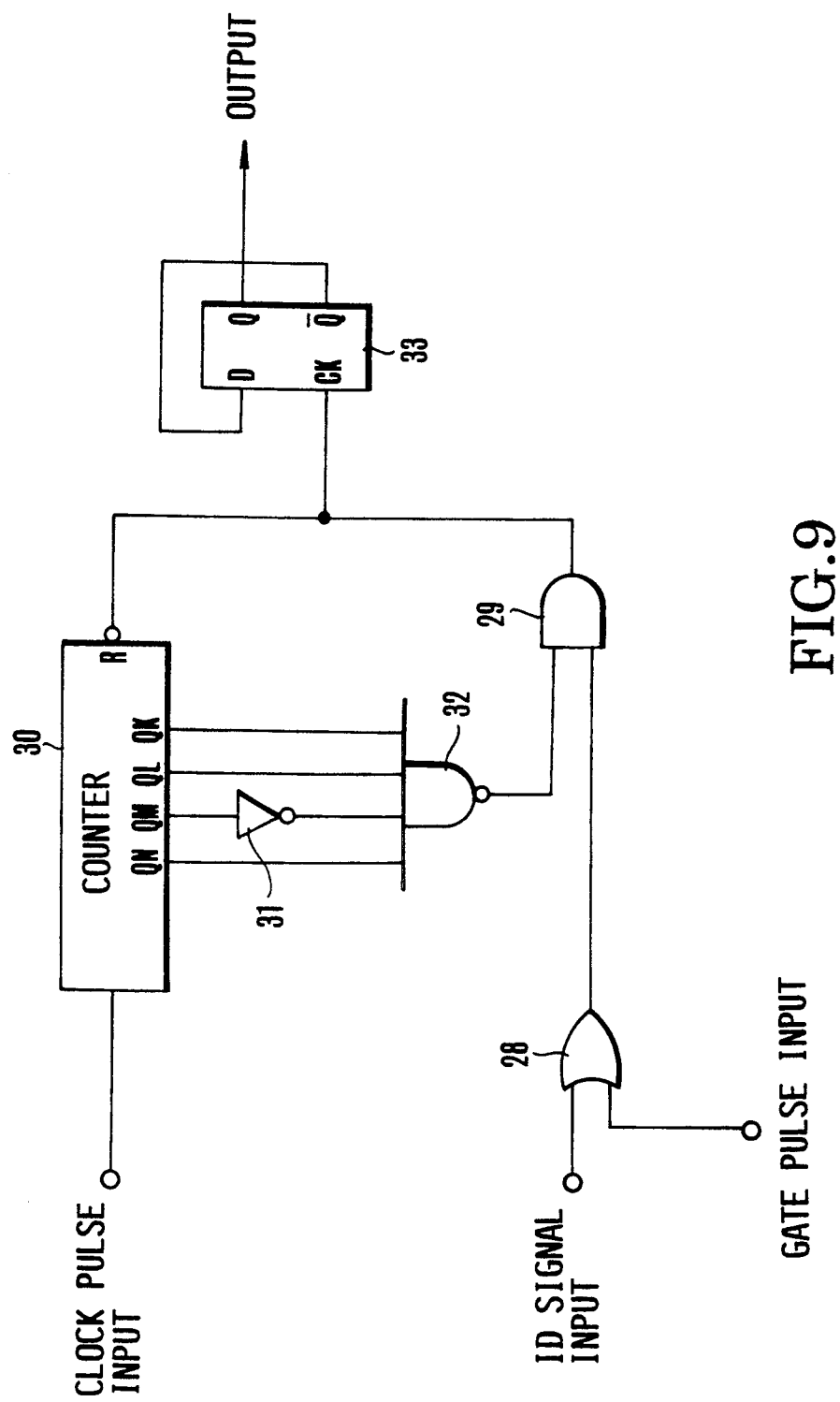
FIG. 9 is a circuit diagram showing a specific example of the circuit construction of the oscillator of FIG. 7.

The oscillators 27b and 27c may be realized with, for example, a circuit arrangement such as that shown in FIG. 9.

FIG. 12 is a timing chart showing signal waveforms appearing at various points in an oscillator having the arrangement shown in FIG. 9.

The operation of the such an oscillator is explained below with reference to FIGS. 9 and 12.

In FIG. 9, an OR gate 28 is supplied with an ID signal (refer to Part (a) of FIG. 12) and a gate pulse (refer to Part (b) of FIG. 12) output from the phase synchronizing/controlling circuit 27a of FIG. 7, and the OR gate 28 supplies a signal having a waveform such as that shown in Part (c) of FIG. 12 to an AND gate 29.

In the meantime, the AND gate 29 is supplied with a signal having a waveform such as that shown in Part (e) of FIG. 12, the signal being formed by a counter 30 which operates in response to a clock pulse generated by a clock signal generating circuit (not shown) as well as an inverter 31 and a NAND gate 32.

Then, the output of the AND gate 29 (refer to Part (d) of FIG. 12) is supplied to the reset terminal R of the counter 30 and the clock terminal CK of a D-flip-flop 33. In this manner, the counter 30 is reset by the leading edge of each pulse which appears during the period indicated by A in Part (d) of FIG. 12, and the D-flip-flop 33 outputs a signal which is the same in frequency as, and is phase-synchronized with, the ID signal during a period subsequent to point B as shown in Part (f) of FIG. 12.

The respective oscillators 27b and 27c operate in the above-described manner and output the signals shown in Parts (d) and (e) of FIG. 10. The signals output from the oscillators 27b and 27c are supplied to the output switching circuit 27d shown in FIG. 7.

In the second embodiment, the counter 30, shown in FIG. 9, of each oscillator is reset during the period specified by each gate pulse so that synchronization between the ID signal and the signal output from the oscillator is established, but this arrangement is intended for illustration only. For example, as the period specified with the aforesaid burst gate, instead of the overall duration of the aforesaid 4H or 2H period, a particular duration in the middle of each of the periods may be selected, and control of phase synchronization with the ID signal may be performed during this particular duration. With this arrangement, even in the case of the ID signal the phase of which is reversed every 2H or 4H period if the information changes from "0" to "1" it becomes possible to control phase synchronization with such an ID signal without being influenced by disturbances which may occur before and after the point at which the ID signal is reversed.

As described above, the signals output from the oscillators 27b and 27c are supplied to the output switching circuit 27d shown in FIG. 7. The output switching circuit 27d alternately outputs these signals in synchronization with output switching pulses (refer to Part (f) of FIG. 10) supplied from the phase synchronizing/controlling circuit 27a.

As shown in Part (f) of FIG. 10, the output switching pulse supplied from the phase synchronizing/controlling circuit 27a has a waveform the phase of which is reversed every 4H or 2H period in synchronization with the gate pulse A. As illustrated, if the supplied output switching pulse is at its high level (the level "H" in Part (f) of FIG. 10), the output switching circuit 27d operates to supply the signal output from the oscillator 27b to the phase comparing circuit 18; if the supplied output switching pulse is at its low level (the level "L" in Part (f) of FIG. 10), the circuit 27d operates to supply the signal output from the oscillator 27c to the phase comparing circuit 18.

Figure 11:
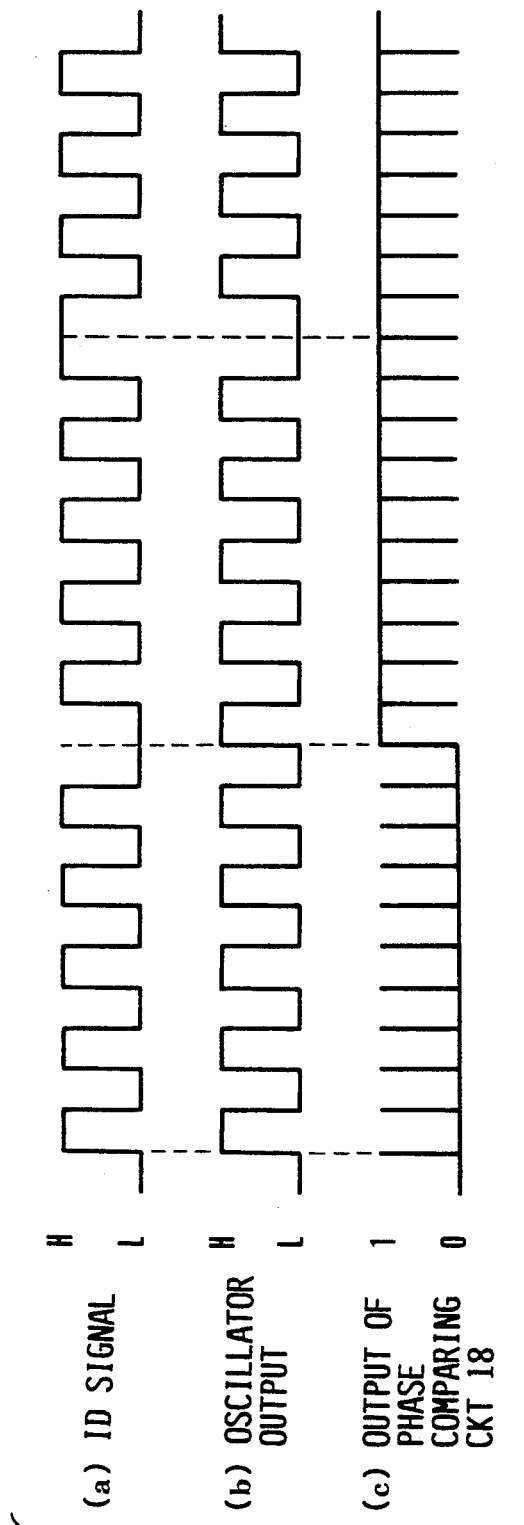
FIG. 11 is a timing chart which serves to illustrate the phase comparing operation of the phase comparing circuit of FIG. 7.

The phase comparing circuit 18 is, as described above, supplied with the signal output from the oscillator 27b or 27c (refer to Part (b) of FIG. 11) and the ID signal separated by the ID signal separating circuit 13 (refer to Part (a) of FIG. 11). The phase comparing circuit 18 compares the phases of both signals and, if their phases are coincident, outputs a low-level signal (the signal "0" in Part (c) of FIG. 11), and, if they are not coincident with each other, outputs a high-level signal (the signal "1" in the same part).

In this manner, the signal output from the phase comparing circuit 18, which represents the results of the phase comparison, is supplied to the majority decision circuit 21.

The majority decision circuit 21 is synchronized with the horizontal synchronizing signal separated by the horizontal synchronizing signal separating circuit 14 to measure and compare the durations of the high-level period and the low-level period of each signal which is output from the gate circuit 20 every 4H or 2H period.

If the duration of the high-level period is longer than that of the low-level period, the majority decision circuit 21 outputs a signal which exhibits a high level over the 4H or 2H period. If, on the other hand, the duration of the low-level period is longer than that of the high-level period, the majority decision circuit 21 outputs a signal which exhibits a low level over the 4H or 2H period.

The above-described majority decision circuit 21 serves to eliminate an erroneous decision which may be made by the phase comparing circuit 18 which is provided as a front-stage element with respect to the majority decision circuit 21. In general, since the ID signal contains time-base errors, the phase comparing circuit 18 frequently outputs an erroneous comparison result because of such errors. It is believed, notwithstanding, that the period during which such an erroneous decision may take place occupies only a small portion of the overall comparison period. Accordingly, by causing the majority decision circuit 12 to make a majority decision as to the comparison results, error-free decision results can be obtained.

The signal which has been output from the majority decision circuit 21 is in turn supplied to the interface 22. The interface 22 translates the supplied signal into a digital ID code and supplies it to the microcomputer 23. The microcomputer 23 decodes the ID code supplied from the interface 22 and controls the operation of the apparatus in accordance with the contents of the decoded ID code.

Moreover, in the arrangement of the second embodiment, information representing a date and time is decoded from the ID code, and the decoded information is displayed on a CRT or a similar display device together with a corresponding still image. For this purpose, the microcomputer 23 controls a character signal generating circuit 24 in accordance with the contents of the ID code decoded by the microcomputer 23 to cause the circuit 24 to output a character image signal corresponding to the contents of this ID code. Then, the multiplexer circuit 16 effects multiplexing of the image signal supplied from the image signal processing circuit 15 and the character image signal output from the character signal generating circuit 24. The multiplexed image signal is supplied to the external display device 26 through the output terminal 25 so that a visual display of the still image and the ID information is provided.

As described above, the second embodiment employs two oscillators to form signals for use in making a phase comparison with an ID signal. This second embodiment is arranged so that, while the phase of the signal output from either of these oscillators is being compared with the phase of the ID signal to detect the phase state thereof, the other oscillator is controlled to oscillate the signal output therefrom in phase synchronization with the ID signal. Their functions are switched between the two oscillators every 4H or 2H period. In general, while the phase of an ID signal is being compared with the signal output from an oscillator, it is impossible to cause the oscillator to oscillate in synchronization with the ID signal. Accordingly, in an arrangement employing one oscillator only, phase comparison and synchronized oscillation must be performed on a time-shared basis and it is therefore necessary to allocate part of a complete 4H or 2H period for the synchronized oscillation. As a result, the time period which can be utilized to perform a phase comparison is so reduced that a decision as to the phase state of the ID signal may contain error. However, with the second embodiment employing the above-described arrangement and construction, it is possible to increase the time period which can be utilized to perform a phase comparison with the ID signal, whereby it is possible to lessen the probability that an error will be contained in a decision as to the phase state of each ID signal.

What is claimed is:

1. An information signal restoring apparatus which is arranged to receive a modulated information signal formed by modulating a predetermined carrier signal in accordance with an information signal and then to restore said received modulated information signal to the original information signal, comprising:
    (A) frequency signal generating means for receiving said modulated information signal to generate a frequency signal which is phase synchronized with the modulated information signal; and
    (B) information signal restoring means arranged to receive said modulated information and to restore the original information signal from said modulated information signal on the basis of the result of a phase comparison made between the modulated information signal which is received during a period excluding a first period and said frequency signal generated by said frequency signal generating means among the results of phase comparison made by said information signal restoring means by effecting phase comparison of the received modulated information and the frequency signal generated by said frequency signal generating means.

2. An information signal restoring apparatus according to claim 1, wherein said frequency signal generating means includes:
    (a) frequency signal generating means for generating a frequency signal having the same frequency as said predetermined carrier signal; and
    (b) phase controlling means for receiving said modulated information signal and for controlling said frequency signal generating means so that said frequency signal generated by said frequency signal generating means is phase synchronized with the modulated information signal during the period excluding said first period.

3. An information signal restoring apparatus according to claim 1, wherein said information signal restoring means includes:
   (a) phase comparing means for receiving said modulated information signal, then for making a phase comparison between said received modulated information signal and the frequency signal generated by said frequency signal generating means, and then for outputting a phase state detection signal corresponding to the result of said phase comparison;
   (b) gate means for causing said phase state detection signal outputted from said phase comparing means not to pass through said gate means during said first period and to pass through said gate means during the period excluding said first period; and
   (c) information signal generating means for generating an information signal on the basis of the phase state detection signal outputted from said gate means.

4. An information signal restoring apparatus which is arranged to receive modulated information signals formed by modulating a predetermined carrier signal in accordance with an information signal and then to restore said received modulated information signal to the original information signal, comprising:
   (A) phase state detecting means which is arranged to receive said modulated information signals and to output a phase state detection signal corresponding to the result of phase state detection obtained during a period excluding a first period among the results of phase state detection obtained by detecting the phase state of the received modulated information signals;
   (B) gate means for causing the phase detection signal outputted from said phase state detection means not to pass through said gate means during said first period and to pass through said gate means during the period excluding said first period; and
   (C) information signal generating means for generating an information signal on the basis of the phase state detection signal outputted from said gate means.

5. An information signal restoring apparatus according to claim 4, wherein said phase state detecting means includes:
   (a) phase holding means arranged to receive said modulated information signal and to hold a phase of said modulated information signal; and
   (b) phase comparing means for making a comparison between a phase of the modulated information signal held by said phase holding means and a phase of a modulated information signal which is not held by said phase holding means during the period excluding said first period.

6. An information signal restoring apparatus according to claim 4, wherein said information signal generating means includes:
   (a) discriminating means arranged to monitor a variation of a level of a phase state detection signal outputted from said gate means and to output a discriminating signal corresponding to a level which occupies the longest period from among all the levels indicated by said phase state detection signal; and
   (b) converting means for converting said discriminating signal outputted from said discriminating means into an information signal.

7. An information signal restoring apparatus which is arranged to receive a modulated information signal formed by modulating a predetermined carrier signal in accordance with an information signal and then to restore said received modulated information signal to the original information signal, comprising:
   (A) frequency signal generating means for generating a frequency signal having the same frequency as said predetermined carrier signal;
   (B) phase controlling means arranged to receive said modulated information signal and to control said frequency signal generating means so that the frequency signal generated by said frequency signal generating means is phase synchronized with the modulated information signal using the received modulated information signal over a period excluding a first period among the received modulated information signals; and
   (C) information signal restoring means arranged to receive said modulated information signal and to restore the original information signal on the basis of the result of phase comparison detected by making a phase comparison between the modulated information signal and the frequency signal generated by said frequency signal generating means.

8. An information signal restoring apparatus according to claim 7, wherein said frequency signal generating means includes first and second oscillators each for generating a frequency signal having the same frequency as said predetermined carrier signal and said phase controlling means is arranged to control said first oscillator and said second oscillator so that the frequency signal generated by said of said first oscillator and said second oscillator is phase synchronized with the modulated information signal during a period excluding said first period, among the received modulated information signals.

9. An information signal restoring apparatus according to claim 8, wherein said information signal generating means includes switching means for outputting the frequency signals generated by said first oscillator and the frequency generated by said second oscillator in an alternate manner in every second period different from first period.

10. An information signal restoring apparatus according to claim 7, wherein said information signal restoring means includes:
   (a) discriminating means arranged to receive said modulated information signal and to monitor the result of phase comparison made between said received modulated information signal and said frequency signal during the period excluding said first period and then to output a discriminating signal corresponding to a phase state which occupies the longest period; and
   (b) converting means for converting said discriminating signal outputted from said discriminating means into an information signal.

* * * * *